United States Patent
Ishida et al.

(10) Patent No.: US 11,508,770 B2
(45) Date of Patent: Nov. 22, 2022

(54) BACK-ILLUMINATED SEMICONDUCTOR LIGHT DETECTING DEVICE

(71) Applicant: HAMAMATSU PHOTONICS K.K., Hamamatsu (JP)

(72) Inventors: Atsushi Ishida, Hamamatsu (JP); Takashi Baba, Hamamatsu (JP); Masanori Okada, Hamamatsu (JP); Terumasa Nagano, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 145 days.

(21) Appl. No.: 17/053,647

(22) PCT Filed: Apr. 25, 2019

(86) PCT No.: PCT/JP2019/017678
§ 371 (c)(1),
(2) Date: Nov. 6, 2020

(87) PCT Pub. No.: WO2019/216242
PCT Pub. Date: Nov. 14, 2019

(65) Prior Publication Data
US 2021/0193707 A1 Jun. 24, 2021

(30) Foreign Application Priority Data
May 10, 2018 (JP) .............................. JP2018-091623

(51) Int. Cl.
*H01L 27/146* (2006.01)
*H04N 5/359* (2011.01)
(Continued)

(52) U.S. Cl.
CPC ...... *H01L 27/1463* (2013.01); *H01L 27/1461* (2013.01); *H01L 27/1464* (2013.01);
(Continued)

(58) Field of Classification Search
CPC .............. G02B 21/367; G02B 21/0052; G02B 21/0032; G02B 21/361; G02B 23/04
See application file for complete search history.

(56) References Cited

U.S. PATENT DOCUMENTS

| | | | |
|---|---|---|---|
| 2010/0214654 A1* | 8/2010 | Birk | ........................ G01J 1/46 |
| | | | 250/214 R |
| 2013/0099346 A1 | 4/2013 | Choong et al. | |

(Continued)

FOREIGN PATENT DOCUMENTS

| | | |
|---|---|---|
| JP | 2005-265607 A | 9/2005 |
| JP | 2006-332796 A | 12/2006 |

(Continued)

OTHER PUBLICATIONS

International Preliminary Report on Patentability dated Nov. 19, 2020 for PCT/JP2019/017678.

*Primary Examiner* — Tony Ko
(74) *Attorney, Agent, or Firm* — Faegre Drinker Biddle & Reath LLP

(57) ABSTRACT

A back-illuminated semiconductor light detecting device includes a light detecting substrate having pixels, and a circuit substrate having signal processing units. For each of the pixels, the light detecting substrate includes avalanche photodiodes respectively having light receiving regions provided in a first main surface side of the semiconductor substrate. In the semiconductor substrate, for each pixel, a trench surrounds at least one region including the light receiving region when viewed from a direction perpendicular to the first main surface. The number of signal processing units is larger than the number of light receiving regions in each pixel, and the number of regions surrounded by the trench in each pixel is equal to or less than the number of light receiving regions in the pixel.

8 Claims, 13 Drawing Sheets

(51) Int. Cl.
 *H01L 31/107* (2006.01)
 *H04N 5/351* (2011.01)

(52) U.S. Cl.
 CPC .. *H01L 27/14634* (2013.01); *H01L 27/14643* (2013.01); *H04N 5/359* (2013.01); *H01L 31/107* (2013.01); *H04N 5/351* (2013.01)

(56) References Cited

U.S. PATENT DOCUMENTS

2018/0026147 A1  1/2018  Zhang et al.
2018/0090526 A1  3/2018  Mandai et al.

FOREIGN PATENT DOCUMENTS

| | | |
|---|---|---|
| JP | 2008-103614 A | 5/2008 |
| JP | 2013-016638 A | 1/2013 |
| JP | 2016-154259 A | 8/2016 |
| JP | 2016-171466 A | 9/2016 |
| JP | 2017-033962 A | 2/2017 |
| JP | 2017-083298 A | 5/2017 |
| JP | 2017-117835 A | 6/2017 |
| JP | 2017-135412 A | 8/2017 |
| WO | WO-2018/021411 A1 | 2/2018 |

* cited by examiner

United States Patent US 11,508,770 B2

BACK-ILLUMINATED SEMICONDUCTOR LIGHT DETECTING DEVICE

TECHNICAL FIELD

The present invention relates to a back-illuminated semiconductor light detecting device.

BACKGROUND ART

A semiconductor light detecting device having a plurality of pixels and a plurality of signal processing units is known (for example, see Patent Literature 1 and 2). The plurality of pixels are two-dimensionally disposed. Each of the pixels includes photodiodes. The plurality of signal processing units process output signals from the corresponding pixels.

CITATION LIST

Patent Literature

[Patent Literature 1] Japanese Unexamined Patent Publication No. 2005-265607
[Patent Literature 2] Japanese Unexamined Patent Publication No. 2006-332796

SUMMARY OF INVENTION

Technical Problem

In order to detect weak light, it is conceivable that each of two-dimensionally disposed pixels be formed of an avalanche photodiode configured to operate in Geiger mode. A reverse voltage equal to or higher than a breakdown voltage is applied to the avalanche photodiode configured to operate in Geiger mode. Therefore, an avalanche photodiode operating in Geiger mode has much higher light sensitivity than a general photodiode of the same pixel size.

However, light emission due to avalanche multiplication can occur in Geiger mode-type avalanche photodiodes. Therefore, when a plurality of avalanche photodiodes are disposed close to each other, one avalanche photodiode may receive light emitted from another avalanche photodiode positioned adjacent to it. In this case, a detection result affected by the light emission of the avalanche photodiodes themselves may be output from the semiconductor light detecting device. As described above, crosstalk may occur due to reception of light emitted from avalanche photodiodes positioned adjacent to each other. An aperture ratio decreases as a space between avalanche photodiodes adjacent to each other is increased to reduce crosstalk.

An objective in one aspect of the present invention is to provide a back-illuminated semiconductor light detecting device capable of securing a detection accuracy for weak light.

Solution to Problem

One aspect of the present invention is a back-illuminated semiconductor light detecting device which includes a light detecting substrate and a circuit substrate connected to the light detecting substrate. The light detecting substrate includes a semiconductor substrate having a first main surface and a second main surface facing each other and includes a plurality of pixels which are two-dimensionally disposed on the semiconductor substrate. The circuit substrate includes a plurality of signal processing units, each of which processes output signals from a corresponding pixel. The light detecting substrate includes, for each of the pixels, a plurality of avalanche photodiodes, a plurality of quenching resistors, and pad electrodes. The plurality of avalanche photodiodes are configured to operate in Geiger mode. The pad electrodes are electrically connected to the plurality of quenching resistors. The plurality of avalanche photodiodes respectively have light receiving regions provided in the first main surface side of the semiconductor substrate. The plurality of quenching resistors are disposed on the first main surface side of the semiconductor substrate, and each of the quenching resistors is electrically connected in series to a corresponding avalanche photodiode. The pad electrodes are disposed on the first main surface side of the above-described semiconductor substrate. The light receiving regions of the plurality of avalanche photodiodes are two-dimensionally disposed for each pixel. In the semiconductor substrate, a trench opens to the first main surface. The trench surrounds at least one region including the light receiving region for each pixel when viewed from a direction perpendicular to the first main surface. Each of the signal processing units includes a front-end circuit to which the plurality of avalanche photodiodes are electrically connected through the corresponding pad electrode. The front-end circuit outputs a signal corresponding to an output signal from the plurality of avalanche photodiodes. The number of the plurality of signal processing units included in the circuit substrate is larger than the number of light receiving regions in each pixel. The number of regions surrounded by the trench in each pixel is equal to or less than the number of light receiving regions in the pixel. The second main surface is a light incident surface of the semiconductor substrate.

In the present aspect, the trench is formed on the first main surface side of the above-described semiconductor substrate. The trench surrounds at least one region including the light receiving region for each pixel when viewed from a direction perpendicular to the first main surface. The number of regions surrounded by the trench in each pixel is equal to or less than the number of light receiving regions in the pixel. In this case, an aperture ratio can also be secured while occurrence of crosstalk due to reception of light emitted from avalanche photodiodes positioned adjacent to each other is suppressed by the trench. Therefore, a detection accuracy for weak light can be secured in the above-described back-illuminated semiconductor light detecting device.

In the present aspect, the trench may penetrate the above-described semiconductor substrate and open to the second main surface. In this case, occurrence of crosstalk due to reception of light emitted from avalanche photodiodes positioned adjacent to each other can be further suppressed.

In the present aspect, the pad electrode may be disposed on the first main surface side to overlap all of the plurality of avalanche photodiodes included in the pixel when viewed from a direction perpendicular to the first main surface. In this case, light incident on the light detecting substrate being emitted from the main surface can be suppressed. As a result, sensitivity to light having a long wavelength can be improved.

In the present aspect, for each pixel, the trench may surround a region in which the pixel is formed. In this case, occurrence of crosstalk between different pixels due to reception of light emitted from avalanche photodiodes positioned adjacent to each other is suppressed by the trench.

In the present aspect, for each pixel, the trench may surround each of the light receiving regions. In this case, occurrence of the above-described crosstalk between the avalanche photodiodes included in each of the pixels can be suppressed by the trench. In each of the light receiving regions, extension of a depletion layer is made uniform in a direction parallel to the main surface, and light detection characteristics in each pixel can be made uniform.

Advantageous Effects of Invention

One aspect of the present invention can provide a back-illuminated light detecting device in which a detection accuracy for weak light is secured.

DESCRIPTION OF EMBODIMENTS

Hereinafter, embodiments of the present invention will be described in detail with reference to the accompanying drawings. In the description, the same elements or elements having the same function will be denoted by the same reference signs and duplicate descriptions thereof will be omitted.

Figure 1:
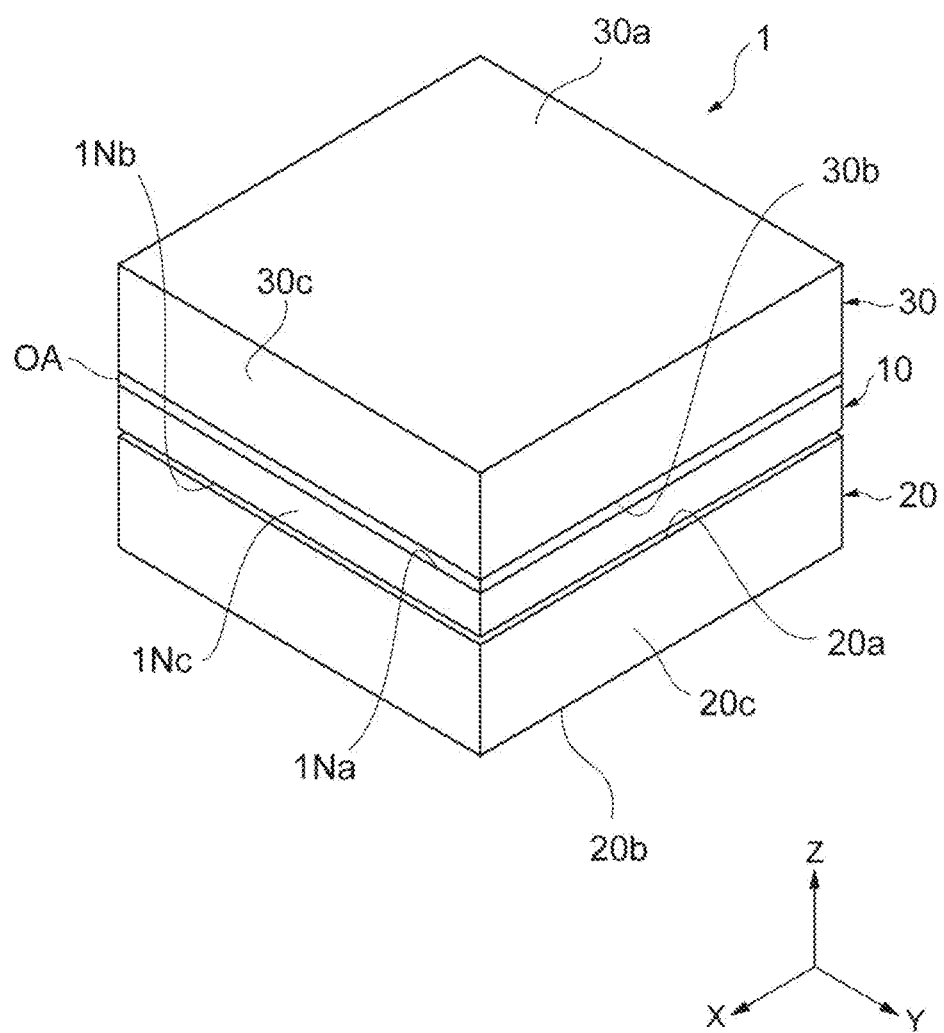
FIG. 1 is a schematic perspective view illustrating a back-illuminated semiconductor light detecting device according to one embodiment.
Figure 2:
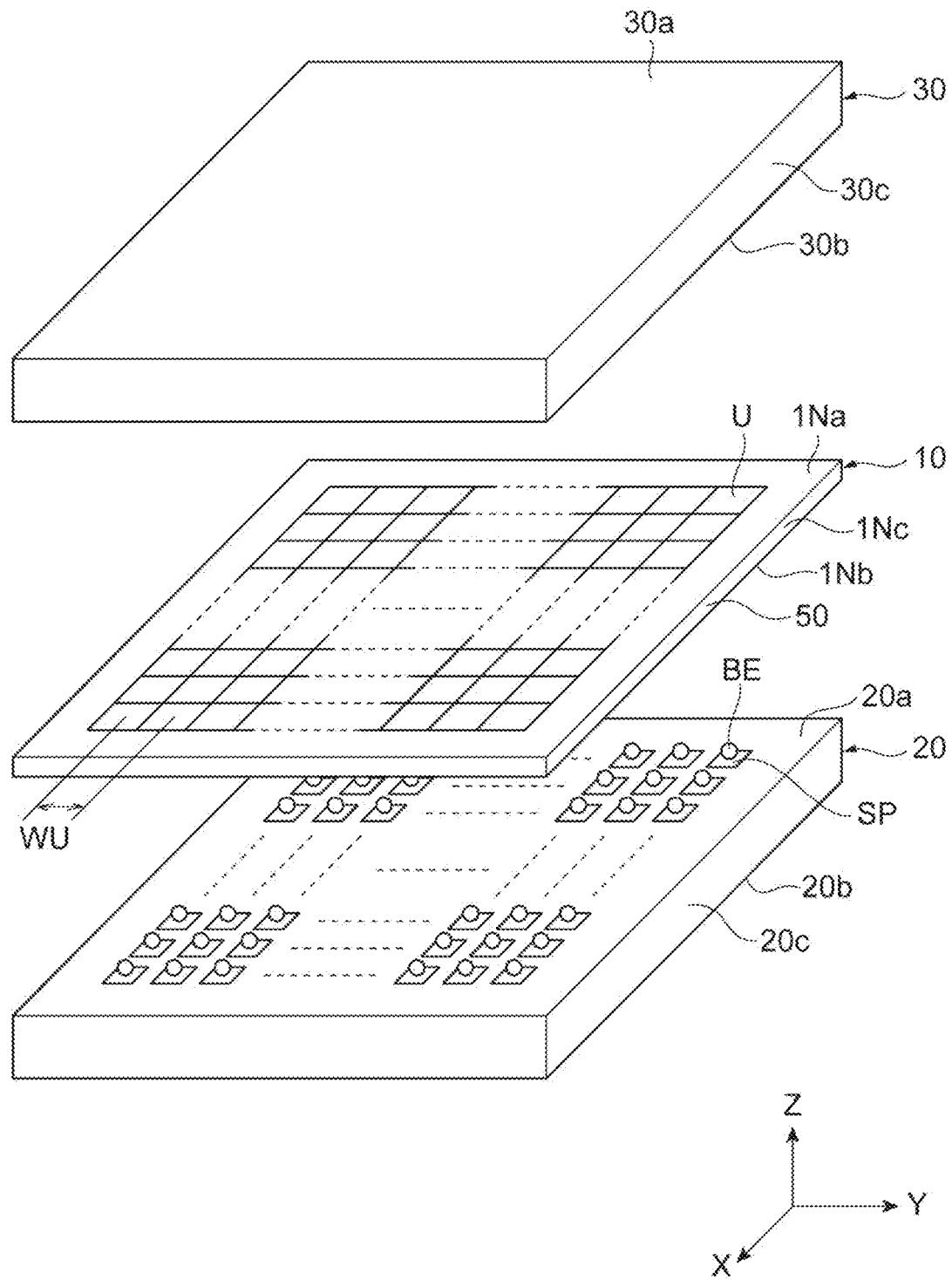
FIG. 2 is an exploded perspective view of the back-illuminated semiconductor light detecting device.

First, a configuration of the back-illuminated semiconductor light detecting device according to the present embodiment will be described with reference to FIGS. 1 and 2. FIG. 1 is a schematic perspective view illustrating a back-illuminated semiconductor light detecting device according to the present embodiment. FIG. 2 is an exploded perspective view of the back-illuminated semiconductor light detecting device illustrated in FIG. 1.

As illustrated in FIGS. 1 and 2, the back-illuminated semiconductor light detecting device 1 includes a light detecting substrate 10, a circuit substrate 20, and a glass substrate 30. The circuit substrate 20 faces the light detecting substrate 10. The glass substrate 30 faces the light detecting substrate 10. The light detecting substrate 10 is disposed between the circuit substrate 20 and the glass substrate 30. In the present embodiment, a plane parallel to each of main surfaces of the light detecting substrate 10, the circuit substrate 20, and the glass substrate 30 is an XY axes plane, and a direction perpendicular to each of the main surfaces is a Z axis direction.

The light detecting substrate 10 includes a semiconductor substrate 50 having a rectangular shape in a plan view. The semiconductor substrate 50 is made of Si and is a P-type semiconductor substrate. The semiconductor substrate 50 has a main surface 1Na and a main surface 1Nb facing each other. The P-type is an example of a first conductivity type. An example of a second conductivity type includes an N-type. The main surface 1Na is a light incident surface of the semiconductor substrate 50.

As illustrated in FIG. 2, the light detecting substrate 10 includes a plurality of pixels U. The plurality of pixels U are two-dimensionally disposed in a matrix shape on the semiconductor substrate 50. The back-illuminated semiconductor light detecting device 1 outputs a signal corresponding to light detected by the plurality of pixels U. In the present embodiment, the number of pixels U is "1024 (32×32)." A pitch WU between the pixels U is 10 to 500 μm in a row direction and a column direction and may be 100 μm as an example. The row direction is an X-axis direction and the column direction is a Y-axis direction.

The glass substrate 30 has a main surface 30a and a main surface 30b facing each other. The glass substrate 30 has a rectangular shape in a plan view. The main surface 30b faces the main surface 1Na of the semiconductor substrate 50. The main surface 30a and the main surface 30b are flat. The glass substrate 30 and the light detecting substrate 10 are optically connected by an optical adhesive OA. The glass substrate 30 may be directly formed on the light detecting substrate 10.

The circuit substrate 20 has a main surface 20a and a main surface 20b facing each other. The circuit substrate 20 has a rectangular shape in a plan view. The light detecting substrate 10 is connected to the circuit substrate 20. The main surface 20a and the main surface 1Nb face each other.

The circuit substrate 20 configures, for example, an application specific integrated circuit (ASIC). As illustrated in FIG. 2, the circuit substrate 20 includes a plurality of signal processing units SP. The plurality of signal processing units SP are two-dimensionally disposed on the main surface 20a side of the circuit substrate 20. Each of the signal processing units SP is electrically connected to the light detecting substrate 10 through a bump electrode BE.

A side surface 1Nc of the semiconductor substrate 50, a side surface 30c of the glass substrate 30, and a side surface 20c of the circuit substrate 20 are on the same plane as each other. That is, an outer edge of the semiconductor substrate 50, an outer edge of the glass substrate 30, and an outer edge of the circuit substrate 20 coincide with each other in a plan view. The outer edge of the semiconductor substrate 50, the outer edge of the glass substrate 30, and the outer edge of the circuit substrate 20 may not coincide with each other. For example, an area of the circuit substrate 20 may be larger than each area of the semiconductor substrate 50 and the glass substrate 30 in a plan view. In this case, the side surface 20c of the circuit substrate 20 is positioned outward from the side surface 1Nc of the semiconductor substrate 50 and the side surface 30c of the glass substrate 30 in a direction of the XY axes plane.

Figure 3:
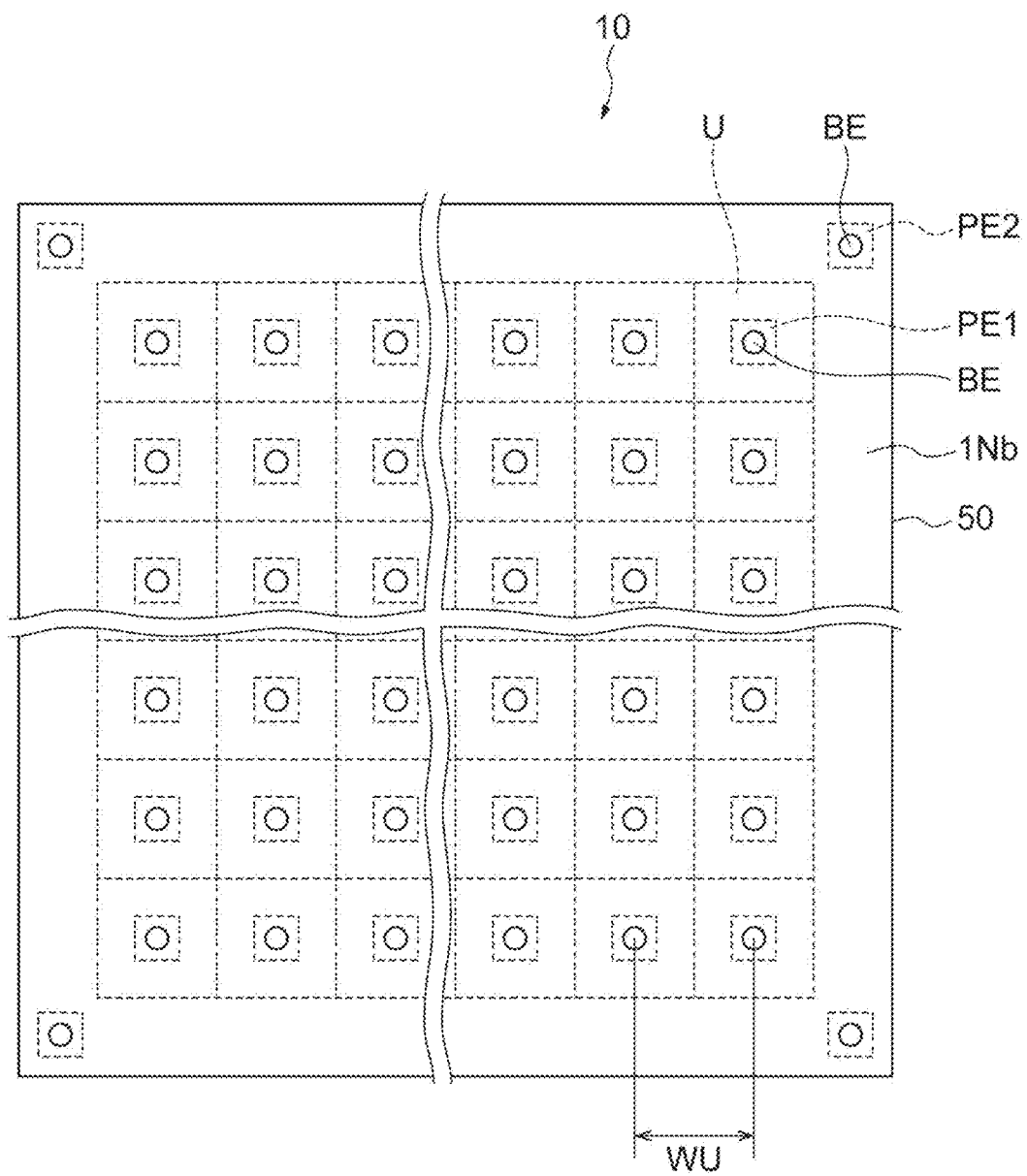
FIG. 3 is a schematic plan view of a light detecting substrate.
Figure 4:
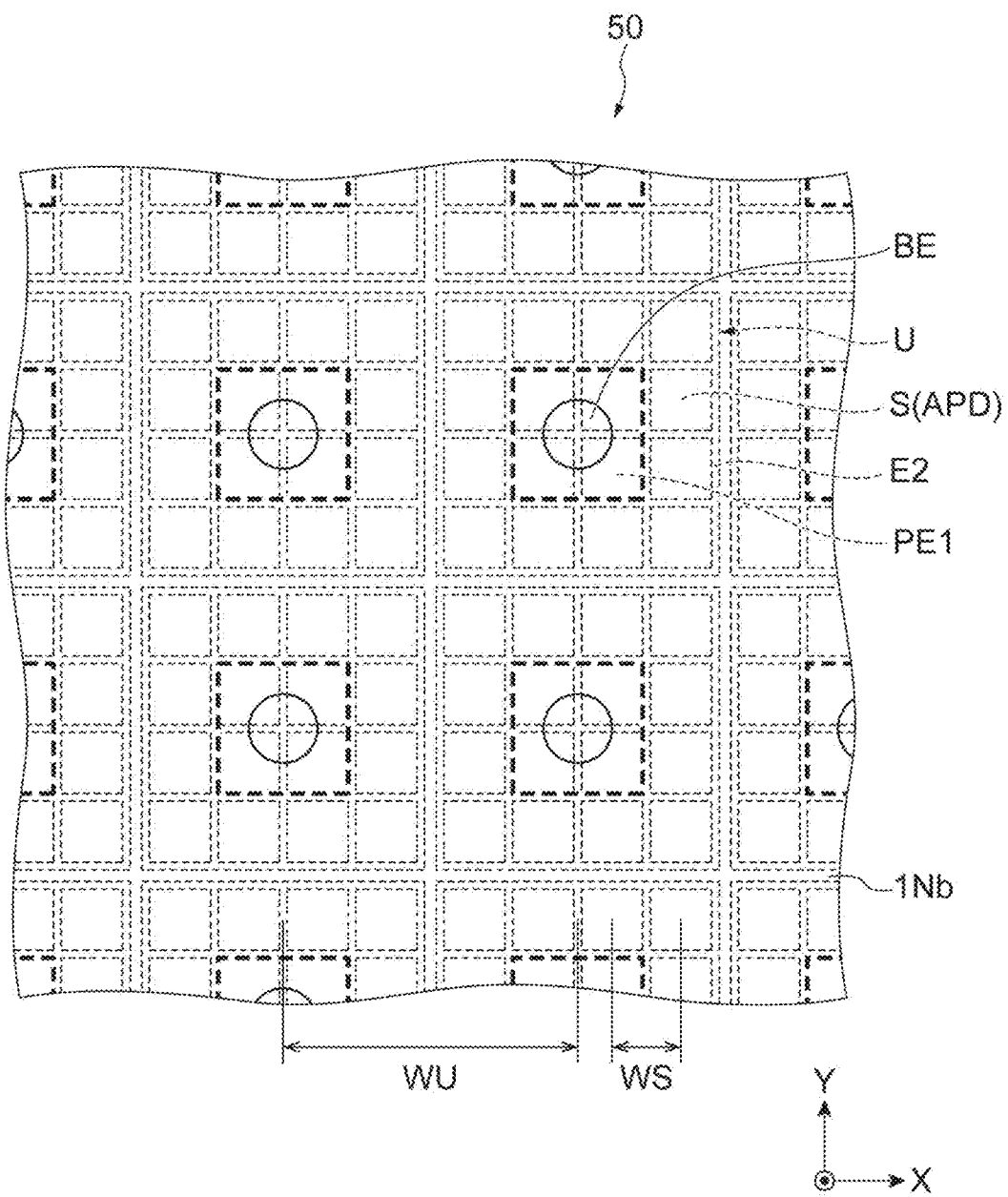
FIG. 4 is a schematic enlarged view of the light detecting substrate.
Figure 5:
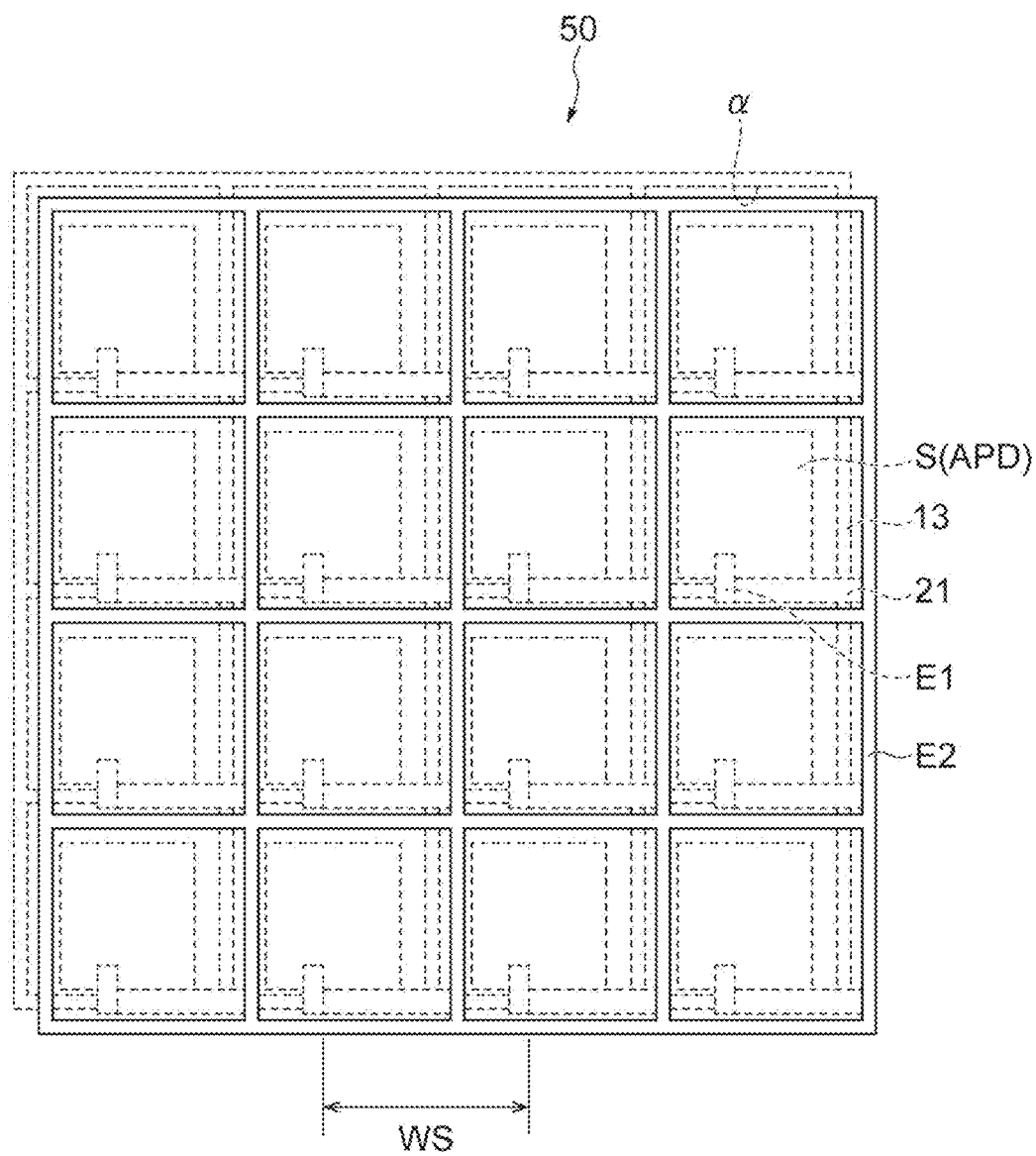
FIG. 5 is a schematic enlarged view of the light detecting substrate.

Next, a configuration of the light detecting substrate 10 will be described with reference to FIGS. 3 to 5. FIG. 3 is a view of the main surface 1Nb of the light detecting substrate 10 from a direction perpendicular to the main surface 1Nb. The direction perpendicular to the main surface 1Nb corresponds to a Z-axis direction. FIG. 4 illustrates a region in which a pad electrode PE1 and the bump electrode BE are provided to correspond to each of the pixels U. FIG. 5 illustrates one of the pixels U in a state in which a layer above an electrode E2 to be described below is removed. That is, in FIG. 5, a layer positioned on the circuit substrate 20 side of the electrode E2 is removed. The light detecting substrate 10 includes a plurality of avalanche photodiodes APD configured to operate in Geiger mode, a plurality of quenching resistors 21, and pad electrodes PE1 and PE2. The plurality of avalanche photodiodes APD configured to operate in Geiger mode, the plurality of quenching resistors 21, and at least one pad electrode PE1 are provided for each of the pixels U in the light detecting substrate 10. In the present embodiment, one pad electrode PE1 is provided for each pixel U.

The plurality of avalanche photodiodes APD are two-dimensionally disposed on the semiconductor substrate 50. Each of the avalanche photodiodes APD includes a light receiving region S that receives light incident from the main surface 1Na side. The light receiving region S is provided in the main surface 1Nb side of the semiconductor substrate 50. As illustrated in FIGS. 4 and 5, each pixel U includes a plurality of light receiving regions S in the light detecting substrate 10. The plurality of light receiving regions S are two-dimensionally disposed in each pixel U. A pitch WS of the light receiving regions S in each pixel U is 5 to 50 μm in the row direction and the column direction and may be 25 μm as an example. The light receiving region S is an electric charge generation region in which electric charges are generated due to incident light. The electric charge generation region corresponds to a light sensitive region. That is, the light receiving region S is a light detecting region.

As illustrated in FIG. 5, each of the light receiving regions S has a rectangular shape when viewed from the Z-axis direction. For each pixel U in the semiconductor substrate 50, a trench 13 surrounds at least one region a that includes the light receiving region S when viewed from the Z-axis direction. The number of regions a surrounded by the trench 13 in each pixel U is equal to or less than the number of light receiving regions S in each pixel U. In the present embodiment, the trench 13 is formed on the main surface 1Nb side to surround an entire circumference of each of the light receiving regions S for each pixel U when viewed from the Z-axis direction. In other words, the trench 13 is provided in a grid shape to pass between the respective light receiving regions S when viewed from the Z-axis direction. In the example illustrated in FIG. 5, the number of light receiving regions S in each pixel U is 16, and the number of regions a surrounded by the trench 13 in each pixel U is 16. In the present embodiment, the number of regions a surrounded by the trench 13 in each pixel U is the same as the number of light receiving regions S in each pixel U. The trench 13 opens to the main surface 1Nb. The region a surrounded by the trench 13 has a rectangular shape when viewed from the Z-axis direction like the light receiving region S.

Figure 6:
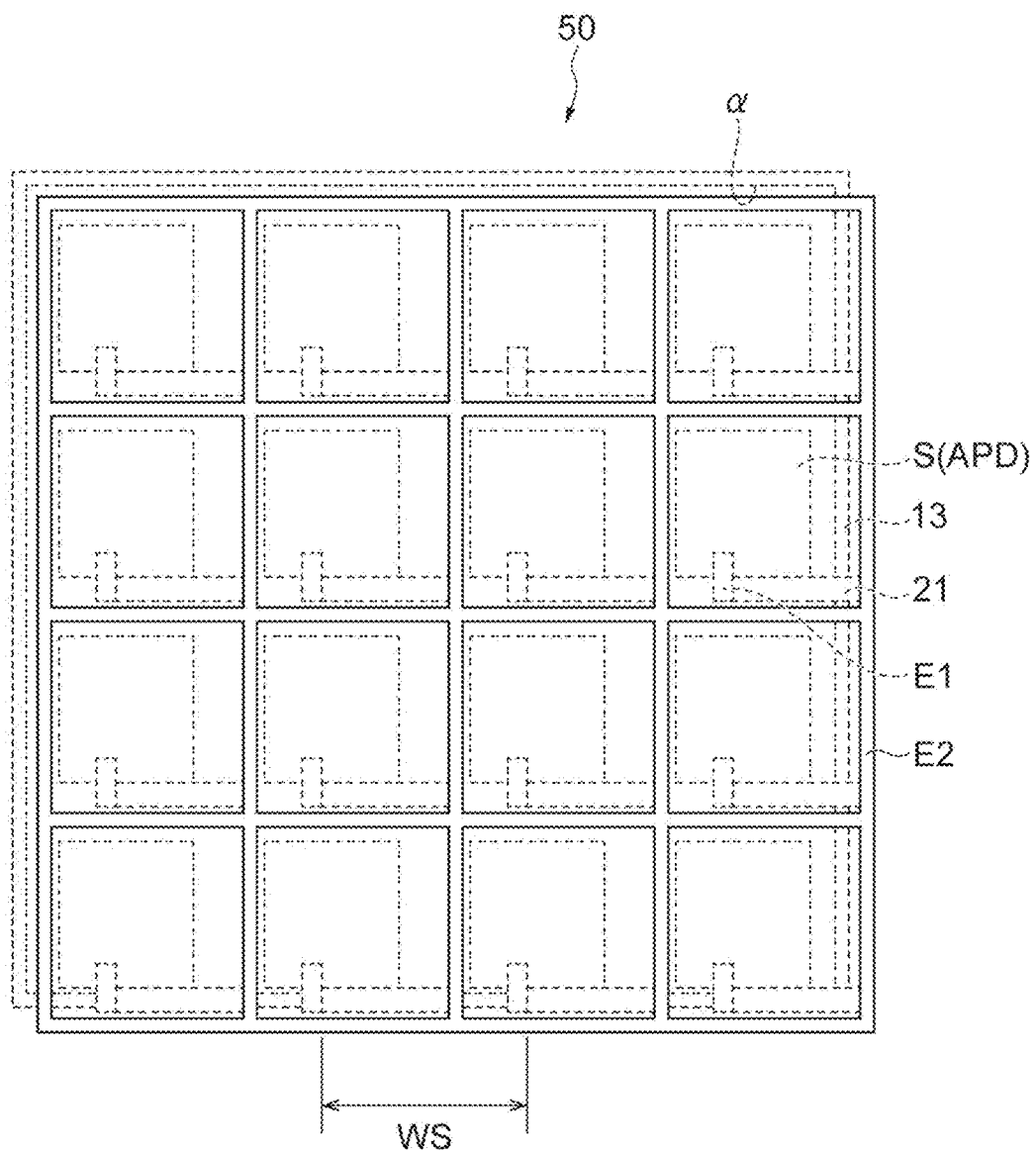
FIG. 6 is a schematic enlarged view of a light detecting substrate in a back-illuminated semiconductor light detecting device according to a modified example of the present embodiment.

The trench 13 may be formed on the main surface 1Nb side to surround the plurality of light receiving regions S for each pixel U when viewed from the Z-axis direction. For example, the trench 13 may collectively surround all the light receiving regions S that constitute one of the pixels U as illustrated in FIG. 6. In other words, the trench 13 may be formed to surround an entire circumference of a region in which one of the pixels U is formed, without being formed between the plurality of light receiving regions S constituting one of the pixels U. In the example illustrated in FIG. 6, the number of light receiving regions S in each pixel U is 16, and the trench 13 collectively surrounds 16 light receiving regions S. Therefore, the number of regions a surrounded by the trench 13 in each pixel U is one. In this case, the number of regions a surrounded by the trench 13 in each pixel U is smaller than the number of light receiving regions S in each pixel U. FIG. 6 is a schematic enlarged view of a light detecting substrate in a back-illuminated semiconductor light detecting device according to a modified example of the present embodiment, and illustrates one of the pixels U.

The trench 13 may collectively surround an arbitrary number of light receiving regions S in each pixel U. For example, additionally from the configuration illustrated in FIG. 6, the trench 13 may be provided to divide each pixel U into four parts when viewed from the Z-axis direction. In this case, in the trench 13, the number of regions a surrounded by the trench 13 in each pixel U is four, and four light receiving regions S are collectively surrounded in each region a. In this case also, the number of regions a surrounded by the trench 13 in each pixel U is smaller than the number of light receiving regions S in each pixel U.

The light detecting substrate 10 includes a plurality of electrodes E1 and the electrode E2 for each pixel U. Each of the electrodes E1 is connected to a corresponding light receiving region S. The electrode E1 is disposed on the main surface 1Nb side of the semiconductor substrate 50 and extends outward from the light receiving region S. The electrode E1 is connected to the quenching resistor 21. The electrode E1 connects the light receiving region S and the quenching resistor 21 corresponding to each other. The electrode E1 includes an end portion connected to the light receiving region S and an end portion connected to the quenching resistor 21.

Each quenching resistor 21 is disposed on the main surface 1Nb side of the semiconductor substrate 50. The quenching resistor 21 extends along an outer edge of the light receiving region S. Each quenching resistor 21 is electrically connected in series to the light receiving region S of a corresponding avalanche photodiode APD through the electrode E1. The quenching resistor 21 configures a passive quenching circuit. The quenching resistor 21 is connected to the electrode E1 and the electrode E2. The quenching resistor 21 includes an end portion connected to the electrode E1 and an end portion connected to the electrode E2.

The electrode E2 is provided in a grid shape to pass between the plurality of light receiving regions S included in each pixels U when viewed from the Z-axis direction. The light receiving region S is surrounded by the electrode E2 when viewed from the Z-axis direction. The electrode E2 is electrically connected to all the light receiving regions S included in one of the pixels U through the electrodes E1 and the quenching resistors 21. The electrode E2 is connected to the pad electrode PE1 corresponding to the pixel U. In the present embodiment, the electrode E2 is connected to the pad electrode PE1 positioned at a center of a corresponding pixel U. With the above-described configuration, all the quenching resistors 21 included in one of the pixels U are electrically connected in parallel to one pad electrode PE1 by the electrode E2. Each pad electrode PE1 is electrically connected to the plurality of avalanche photodiodes APD included in the corresponding pixel U through the electrodes E1, the quenching resistors 21, and the electrode E2. In other words, each pad electrode PE1 is electrically connected to the plurality of light receiving regions S included in the corresponding pixel U through the electrodes E1, the quenching resistors 21, and the electrode E2.

The plurality of pad electrodes PE1 are positioned in regions in which the plurality of pixels U are two-dimensionally disposed when viewed from the Z-axis direction. Each of the pad electrodes PE1 is disposed on the main surface 1Nb side to overlap at least one avalanche photodiode APD among the plurality of avalanche photodiodes APD included in the corresponding pixel U when viewed from the Z-axis direction. In the present embodiment, as illustrated in FIG. 4, each pad electrode PE1 has a rectangular shape and is disposed to overlap four avalanche photodiodes APD positioned at a center of the pixel U among the sixteen avalanche photodiodes APD included in one of the pixels U. The bump electrode BE is disposed at a center of each pad electrode PE1 when viewed from the Z-axis direction.

Figure 7:
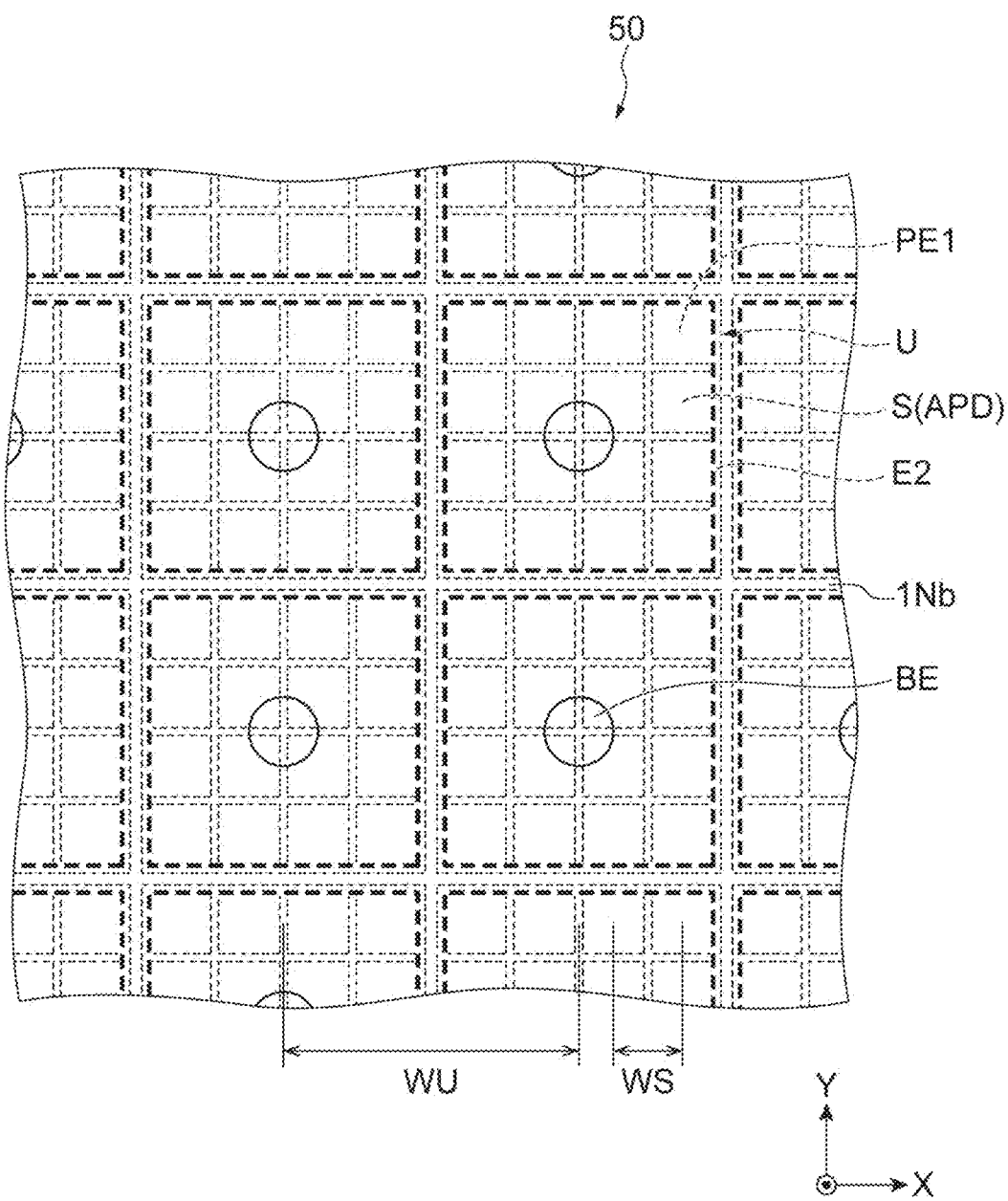
FIG. 7 is a schematic enlarged view of a light detecting substrate in a back-illuminated semiconductor light detecting device according to a modified example of the present embodiment.

In the present embodiment, each pad electrode PE1 is in contact with the electrode E2 that surrounds the four light receiving regions S positioned at the center of each pixel U when viewed from the Z-axis direction. As illustrated in FIG. 7, the pad electrode PE1 may be in contact with all of the plurality of avalanche photodiodes APD included in the pixel U. In this case, each pad electrode PE1 may be disposed on the main surface 1Nb side, for example, to overlap all of the plurality of avalanche photodiodes APD included in the pixel U when viewed from the Z-axis direction. FIG. 7 is a schematic enlarged view of a light detecting substrate in a back-illuminated semiconductor light detecting device according to a modified example of the present embodiment.

On the main surface 1Nb side, the pad electrode PE2 is disposed to be spaced apart from a region in which the plurality of pixels U are disposed. The pad electrode PE2 is a common electrode for applying a voltage to the avalanche photodiodes APD from the main surface 1Na side. In the present embodiment, as illustrated in FIG. 3, the pad electrode PE2 has a rectangular shape and is disposed at four corners of the main surface 1Nb. The bump electrode BE is also disposed on the pad electrode PE2.

Figure 8:
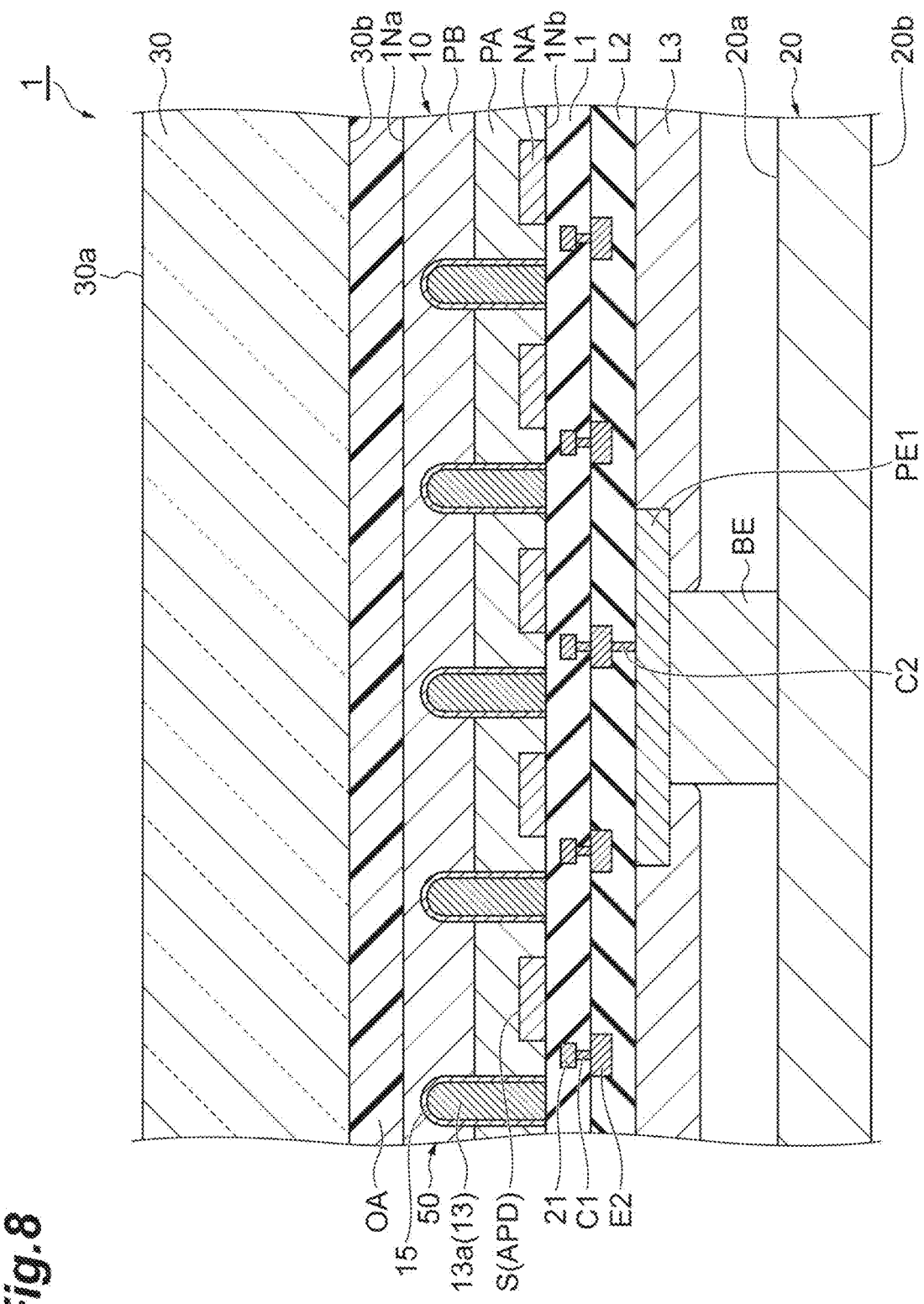
FIG. 8 is a view illustrating a cross-sectional configuration of the back-illuminated semiconductor light detecting device.

Next, a configuration of the back-illuminated semiconductor light detecting device 1 according to the present embodiment will be described with reference to FIG. 8. FIG. 8 illustrates a cross-sectional configuration of the back-illuminated semiconductor light detecting device.

Each of the avalanche photodiodes APD includes a P-type first semiconductor region PA, a P-type second semiconductor region PB, and an N-type third semiconductor region NA. The first semiconductor region PA is positioned on the main surface 1Nb side of the semiconductor substrate 50. The second semiconductor region PB is positioned on the main surface 1Na side of the semiconductor substrate 50. The third semiconductor region NA is formed in the first semiconductor region PA. An impurity concentration of the second semiconductor region PB is higher than an impurity concentration of the first semiconductor region PA. The light receiving region S is formed by the first semiconductor region PA and the third semiconductor region NA. Each avalanche photodiode APD is formed of a $P^+$ layer that is the second semiconductor region PB, a $P^-$ layer that is the first semiconductor region PA, and an $N^+$ layer that is the third semiconductor region NA in order from the main surface 1Na side.

The trench 13 is formed in the semiconductor substrate 50 to surround the third semiconductor region NA. As illustrated in FIG. 8, the trench 13 penetrates the first semiconductor region PA in the Z-axis direction and reaches the second semiconductor region PB. A core 13a is disposed in the trench 13. The core 13a is made of a metal having a high melting point. The core 13a may be made of, for example, tungsten. A surface of the trench 13 is formed of a P-type semiconductor layer 15 having an impurity concentration higher than that of the first semiconductor region PA. That is, the core 13a is covered with the semiconductor layer 15 in the semiconductor substrate 50.

An insulating layer L1 is disposed on the first semiconductor region PA, the third semiconductor region NA, and the trench 13. The quenching resistor 21 is covered with the insulating layer L1. The electrode E2 is disposed on the insulating layer L1 and covered with an insulating layer L2. The pad electrode PE1 is disposed on the insulating layer L2. The insulating layer L2 is covered with the pad electrode PE1 and a passivation layer L3. The passivation layer L3 also covers a part of the pad electrode PE1.

The quenching resistor 21 is connected to the third semiconductor region NA through the electrode E1. The quenching resistor 21 is connected to a corresponding electrode E2 through a connection portion C1. The electrode E2 is connected to a corresponding pad electrode PE1 through a connection portion C2. The pad electrode PE1 is connected to the bump electrode BE at a portion exposed from the passivation layer L3.

In the present embodiment, the optical adhesive OA is disposed on the second semiconductor region PB, that is, on the main surface 1Na. The glass substrate 30 is joined to the semiconductor substrate 50 with an optical adhesive OA. The optical adhesive OA may be, for example, a resin having light transmittance.

The electrodes E1 and E2, the pad electrodes PE1 and PE2, the connection portion C1, and the connection portion C2 are made of a metal. The electrodes E1 and E2, the pad electrodes PE1 and PE2, the connection portion C1, and the connection portion C2 may be made of, for example, aluminum (Al). When the semiconductor substrate 50 is made of Si, the electrode materials may be made of, for example, copper (Cu) besides aluminum. The electrodes E1 and E2, the pad electrode PE1, the connection portion C1, and the connection portion C2 may be integrally formed. The electrodes E1 and E2, the pad electrode PE1, the connection portion C1, and the connection portion C2 may be formed using, for example, a sputtering method.

When Si is used for a material of the semiconductor substrate 50, an element of the group III can be used as the P-type impurity and an element of the group V is used as the N-type impurity. For example, B may be used as the element of the group III of the P-type impurity. For example, P or As may be used as the element of the group V of the N-type impurity. A device in which the N-type and the P-type, which are conductivity types of a semiconductor, are replaced with each other also functions as a back-illuminated semiconductor light detecting device as in the light detecting substrate 10. As a method for doping these impurities, for example, a diffusion method or an ion implantation method can be used.

The insulating layers L1 and L2 and the passivation layer L3 may be made of, for example, $SiO_2$, SiN, or a resin. As a method of forming the insulating layers L1 and L2 and the passivation layer L3, a thermal oxidation method, a sputtering method, a CVD method, or a resin coating method can be used.

The circuit substrate 20 is electrically connected to the pad electrode PE1 by the bump electrode BE. Each signal processing unit SP includes an electrode disposed to correspond to the pad electrode PE1, and the electrode is electrically connected to the corresponding pad electrode PE1 through the bump electrode BE. A signal output from each avalanche photodiode APD is guided to a corresponding signal processing unit SP through the electrode E1, the quenching resistor 21, the electrode E2, the pad electrode PE1, and the bump electrode BE.

The bump electrode BE is formed on the pad electrode PE1 with a under bump metal (UBM) (not illustrated) interposed therebetween. The UBM is made of a material that is excellent in electrical and physical connection to the bump electrode BE. The UBM may be formed using, for example, an electroless plating method. The bump electrode BE may be formed using, for example, a method of mounting a solder ball, a printing method, or electrolytic plating. The bump electrode BE may be made of, for example, solder or indium.

Figure 9:
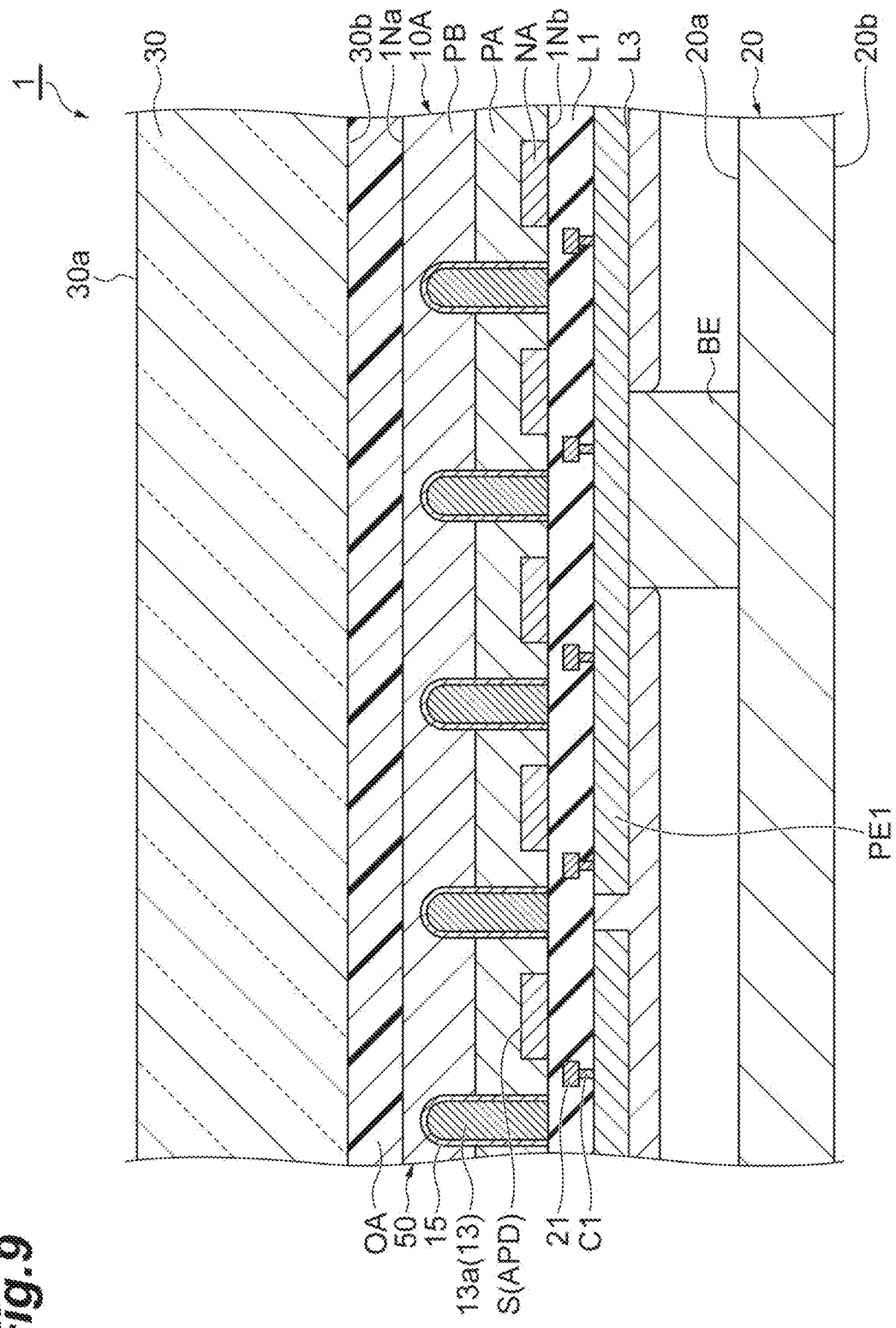
FIG. 9 is a view illustrating a cross-sectional configuration of a back-illuminated semiconductor light detecting device according to a modified example of the present embodiment.

Next, a configuration of a back-illuminated semiconductor light detecting device according to a modified example of the present embodiment will be described with reference to FIG. 9. FIG. 9 is a view illustrating a cross-sectional configuration of a back-illuminated semiconductor light detecting device according to a modified example of the present embodiment. A light detecting substrate 10A illustrated in FIG. 9 differs from the light detecting substrate 10 illustrated in FIG. 8 in the following points. The light detecting substrate 10A does not include the electrode E2, the connection portion C2, and the insulating layer L2. The pad electrode PE1 is disposed on the main surface 1Nb side to overlap all of the plurality of avalanche photodiodes APD included in the pixel U when viewed from the Z-axis direction. In the light detecting substrate 10A illustrated in FIG. 9, the quenching resistor 21 is connected to the pad electrode PE1 through the connection portion C1 without passing through the electrode E2. In this configuration, for example, all the quenching resistors 21 connected to one of the pixels U may be connected to the pad electrode PE1 through the connection portion C1.

Figure 10:
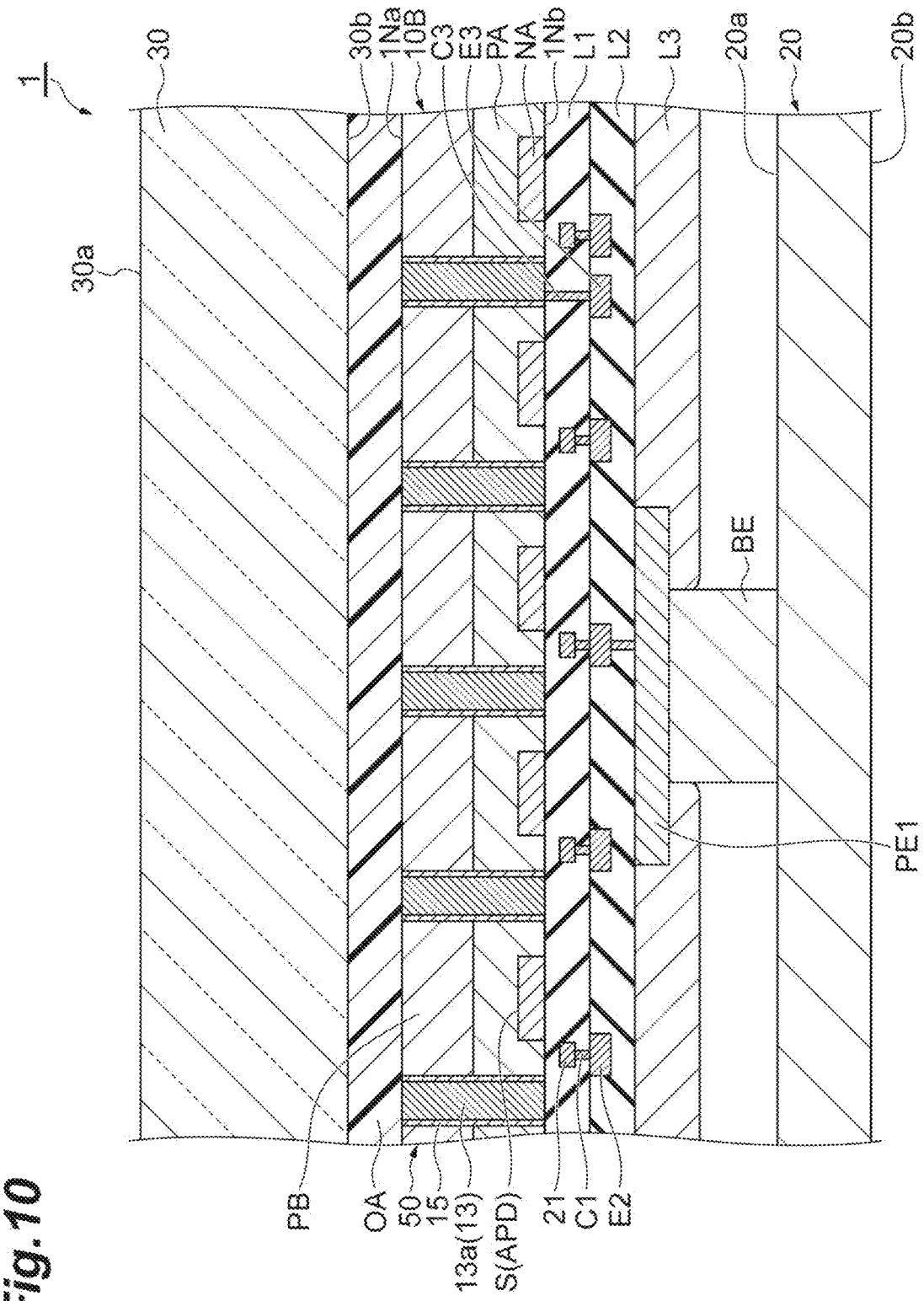
FIG. 10 is a view illustrating a cross-sectional configuration of a back-illuminated semiconductor light detecting device according to a modified example of the present embodiment.

Next, a configuration of a back-illuminated semiconductor light detecting device according to a modified example of the present embodiment will be described with reference to FIG. 10. FIG. 10 is a view illustrating a cross-sectional configuration of a back-illuminated semiconductor light detecting device according to a modified example of the present embodiment. A light detecting substrate 10B illustrated in FIG. 10 differs from the light detecting substrate 10 illustrated in FIG. 8 in the following points. The trench 13 penetrates the semiconductor substrate 50 and opens to the main surface 1Na. An electrode E3 is connected to the core 13a disposed in the trench 13 through a connection portion C3. The electrode E3 is electrically connected to the pad electrode PE2 and electrically connected also to the second semiconductor region PB through the connection portion C3 and the core 13a.

Figure 11:
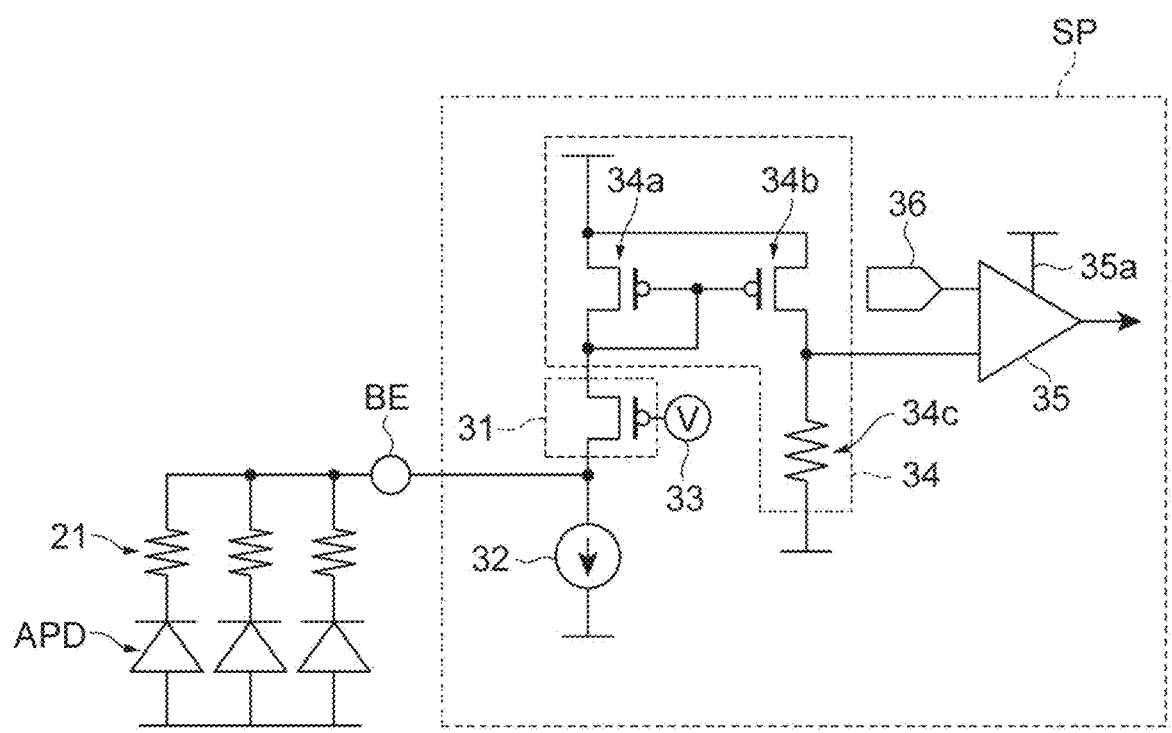
FIG. 11 is a circuit diagram of a back-illuminated semiconductor light detecting device.

Next, a configuration of the circuit substrate according to the present embodiment will be described with reference to FIGS. 2 and 11. FIG. 11 illustrates a circuit configuration of the back-illuminated semiconductor light detecting device 1.

As illustrated in FIG. 2, the circuit substrate 20 includes the plurality of signal processing units SP. The plurality of signal processing units SP are two-dimensionally disposed on the main surface 20a side of the circuit substrate 20. The signal processing unit SP is a front-end circuit that processes a signal from the corresponding avalanche photodiode APD as a previous stage for outputting a signal to a subsequent stage connected to the back-illuminated semiconductor light detecting device 1.

In the subsequent stage circuit, an output pulse of the back-illuminated semiconductor light detecting device 1 may be deteriorated due to a passive element included in the subsequent stage circuit. The signal processing unit SP is configured to transmit a pulse waveform of the output signal from each avalanche photodiode APD to the subsequent stage circuit. The signal processing unit SP has low impedance and a high frequency response. The signal processing unit SP transmits a high-speed rise of the output signal of each avalanche photodiode APD to the subsequent stage circuit. Therefore, deterioration of the output pulse of the back-illuminated semiconductor light detecting device 1 is suppressed. The number of signal processing units SP is larger than the number of the plurality of light receiving regions S included in each pixel U. In the present embodiment, the number of signal processing units SP is "1024" and the number of light receiving regions S included in each pixel U is "16."

The signal processing unit SP includes an input end electrically connected to the bump electrode BE. Output signals from the plurality of avalanche photodiodes APD included in the corresponding pixel U are respectively input to the signal processing units SP through the quenching resistors 21, the pad electrode PE1, and the bump electrode BE. Each signal processing unit SP processes the input output signal.

Each signal processing unit SP includes a grounded-gate circuit 31, a current mirror circuit 34, and a comparator 35. In the present embodiment, the grounded-gate circuit 31 and the current mirror circuit 34 includes a P-channel metal-oxide-semiconductor field effect transistor (MOS FET).

The grounded-gate circuit 31 is inserted between the pad electrode PE1 and the current mirror circuit 34 corresponding to each other. A drain of the FET included in the grounded-gate circuit 31 is electrically connected in series to a corresponding bump electrode BE. An output signal from the plurality of avalanche photodiodes APD included in the corresponding pixel U is input to the grounded-gate circuit 31 through the corresponding pad electrode PE1. A constant current source 32 is electrically connected to the drain in parallel with the bump electrode BE. A voltage source 33 is electrically connected to a gate of the FET included in the grounded-gate circuit 31. An input terminal of the current mirror circuit 34 is electrically connected to a source of the FET included in the grounded-gate circuit 31.

The current mirror circuit 34 is electrically connected to the grounded-gate circuit 31. An output signal from the grounded-gate circuit 31 is input to the current mirror circuit 34. The plurality of avalanche photodiodes APD are electrically connected to the current mirror circuit 34 through the corresponding pad electrode PE1. A signal corresponding to the output signal from the plurality of avalanche photodiodes APD is input to the current mirror circuit 34. The current mirror circuit 34 outputs a signal corresponding to the input output signal from the plurality of avalanche photodiodes APD.

The current mirror circuit 34 includes P-channel MOS FETs 34a and 34b which are paired with each other. An output terminal of the grounded-gate circuit 31 is electrically connected to a drain of the FET 34a. The drain and a gate of the FET 34a are short-circuited. The gate of the FET 34a is electrically connected to a gate of the FET 34*b*. Sources of the FET 34*a* and the FET 34*b* are grounded. A drain of the FET 34*b* is electrically connected to a resistor 34*c* and an input terminal of the comparator 35. The resistor 34*c* is electrically connected to the drain of the FET 34*b* in parallel with the input terminal of the comparator 35. The resistor 34*c* has an end portion electrically connected to the drain of the FET 34*b* and an end portion that is grounded.

The comparator 35 includes first and second input terminals and an output terminal. The first input terminal of the comparator 35 is electrically connected to an output terminal of the current mirror circuit 34 that is the drain of the FET 34*b*. An output signal of the current mirror circuit 34 is input to the comparator 35. A variable voltage source 36 is electrically connected to the second input terminal of the comparator 35. A voltage source is electrically connected to a power supply terminal 35*a* of the comparator 35. The comparator 35 outputs a digital signal corresponding to the output signal from the plurality of avalanche photodiodes APD included in one of the pixels U from an output terminal thereof.

Figure 12:
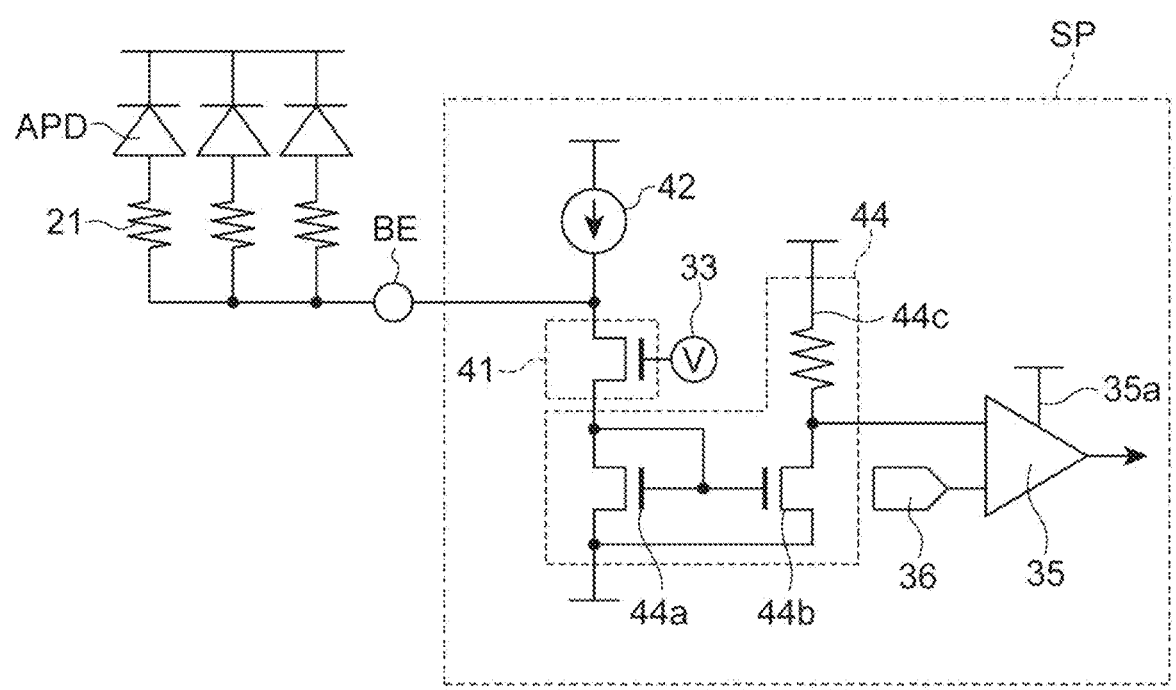
FIG. 12 is a circuit diagram of a back-illuminated semiconductor light detecting device according to a modified example of the present embodiment.

When the N-type and the P-type are replaced with each other in each of the avalanche photodiodes APD, each signal processing unit SP may have a circuit configuration illustrated in FIG. 12. In this case, a polarity of the avalanche photodiode APD is reversed with respect to that of the pad electrode PE1. The signal processing unit SP includes a current mirror circuit 44 instead of the current mirror circuit 34. The current mirror circuit 44 includes N-channel MOS FETs 44*a* and 44*b* which are paired with each other. The signal processing unit SP includes a grounded-gate circuit 41 instead of the grounded-gate circuit 31. The grounded-gate circuit 41 includes a P-channel MOS FET.

A drain of the FET included in the grounded-gate circuit 41 is electrically connected in series to the corresponding bump electrode BE. The output signal from the plurality of avalanche photodiodes APD included in the corresponding pixel U is input to the grounded-gate circuit 41 through the corresponding pad electrode PE1. A constant current source 42 is electrically connected to the drain in parallel with the bump electrode BE. Current directions of the constant current source 42 and the constant current source 32 are opposite to each other. The voltage source 33 is electrically connected to a gate of the FET included in the grounded-gate circuit 41. An input terminal of the current mirror circuit 44 is electrically connected to a source of the FET included in the grounded-gate circuit 41.

The current mirror circuit 44 is electrically connected to the grounded-gate circuit 41. An output signal from the grounded-gate circuit 41 is input to the current mirror circuit 44. The plurality of avalanche photodiodes APD are electrically connected to the current mirror circuit 44 through the corresponding pad electrode PE1. A signal corresponding to the output signal from the plurality of avalanche photodiodes APD is input to the current mirror circuit 44. The current mirror circuit 44 outputs a signal corresponding to the input output signal from the plurality of avalanche photodiodes APD.

An output terminal of the grounded-gate circuit 41 is electrically connected to a drain of the FET 44*a*. The drain and a gate of the FET 44*a* are short-circuited. The gate of the FET 44*a* is electrically connected to a gate of the FET 44*b*. Sources of the FET 44*a* and the FET 44*b* are grounded. A drain of the FET 44*b* is electrically connected to a resistor 44*c* and an input terminal of the comparator 35. The resistor 44*c* is electrically connected to the drain of the FET 44*b* in parallel with the input terminal of the comparator 35. The resistor 44*c* includes an end portion electrically connected to the drain of the FET 44*b* and an end portion that is grounded.

Referring again to FIG. 11, an operation of the back-illuminated semiconductor light detecting device 1 according to the present embodiment will be described.

In the light detecting substrate 10, each avalanche photodiode APD configured to operate in the Geiger mode. In Geiger mode, a reverse voltage larger than a breakdown voltage of the avalanche photodiode APD is applied between an anode and a cathode of the avalanche photodiode APD. The reverse voltage is also referred to as a reverse bias voltage. In the present embodiment, the anode is the first semiconductor region PA and the cathode is the third semiconductor region NA. The first semiconductor region PA is electrically connected to an electrode (not illustrated) disposed on a back-surface side of the semiconductor substrate 50 through the second semiconductor region PB. The "back-surface side" indicates the main surface 1Na side. The electrode disposed on the back-surface side of the semiconductor substrate 50 is electrically connected to the pad electrode PE2. The third semiconductor region NA is electrically connected to the electrode E1. For example, a negative potential is applied to the first semiconductor region PA through the pad electrode PE2, and a positive potential is applied to the third semiconductor region NA through the electrode E1. Polarities of these potentials are relative to each other. Further, in the configuration illustrated in FIG. 10, the potential is applied to the first semiconductor region PA through the pad electrode PE2, the electrode E3, and the core 13*a*.

When light (photons) is incident on the avalanche photodiodes APD, photoelectric conversion is performed inside the semiconductor substrate and photoelectrons are generated. Avalanche multiplication is performed in a region near a PN junction interface of the first semiconductor region PA, and the amplified electron group flows to the circuit substrate 20 through the second semiconductor region PB and the above-described electrode disposed on the back-surface side of the semiconductor substrate 50. The "back surface side" indicates the main surface 1Na side. The electron group flows into the third semiconductor region NA from the circuit substrate 20 through the bump electrode BE, the pad electrode PE1, the electrode E2, the quenching resistors 21, and the electrodes E1. That is, a current signal is detected in the circuit substrate 20 through the electrodes E1, the quenching resistors 21, the electrode E2, the pad electrode PE1, and the bump electrode BE. In other words, when light (photons) is incident on any of the light receiving regions S of the light detecting substrate 10, generated photoelectrons are multiplied, and a signal due to the multiplied photoelectrons is taken out of the bump electrode BE and input to the corresponding signal processing unit SP. The signal processing unit SP outputs a digital pulse signal corresponding to the input signal from the output terminal.

As described above, the trench 13 that opens the main surface 1Nb of the above-described semiconductor substrate 50 is formed in the back-illuminated semiconductor light detecting device 1. The trench 13 surrounds at least one region a that includes the light receiving regions S for each pixel U when viewed from a direction perpendicular to the main surface 1Nb. Therefore, crosstalk between the light receiving regions S positioned in the region a surrounded by the trench 13 and the light receiving regions S outside the region a in which the light receiving regions S are positioned can be reduced by the trench 13. For example, crosstalk due to reception of light emitted by avalanche photodiodes APD positioned adjacent to each other can be reduced. The number of regions a surrounded by the trench 13 in each pixel U is equal to or less than the number of light receiving regions S in the pixel U. Therefore, an aperture ratio can be secured while occurrence of the above-described crosstalk is suppressed by the trench 13. Therefore, a detection accuracy for weak light can be secured in the back-illuminated semiconductor light detecting device 1 described above.

In the back-illuminated semiconductor light detecting device 1 illustrated in FIG. 10, the trench 13 penetrates the above-described semiconductor substrate 50 and opens to the main surface 1Na. In this case, occurrence of crosstalk due to reception of light emitted by avalanche photodiodes APD position adjacent to each other can be further suppressed.

In the back-illuminated semiconductor light detecting device 1 illustrated in FIG. 6, the pad electrode PE1 is disposed on the main surface 1Nb side to overlap all of the plurality of avalanche photodiodes APD included in the pixel U when viewed from the Z-axis direction. Therefore, it can be suppressed that light incident on the light detecting substrate 10 is emitted from the main surface 1Nb. As a result, sensitivity to light having a long wavelength can be improved.

For each pixel U in the back-illuminated semiconductor light detecting device 1, the trench 13 surrounds the region a in which the pixel U is formed. Therefore, occurrence of the above-described crosstalk between different pixels U can be suppressed by the trench 13.

In the back-illuminated semiconductor light detecting device 1, the trench 13 surrounds each light receiving region S for each pixel U. In this case, occurrence of the above-described crosstalk between the avalanche photodiodes APD included in each pixel U can be suppressed by the trench 13. In each light receiving region S, extension of a depletion layer is made uniform in a direction parallel to the main surface 1Nb, and light detection characteristics in each pixel U can be made uniform.

When light sensitivity of each pixel U is low, it is difficult to image weak light. When a light receiving area of the pixel U is large, light sensitivity of the pixel U is secured compared to a case in which the light receiving area of the pixel U is small. The weak light as an object to be imaged may include, for example, a single photon. However, when a light receiving area of the pixel U is large, there is a likelihood that the following problems occur. Since a pitch between the pixels U cannot be easily made small, sufficient resolution cannot be secured in imaging. Since background light is easily received by each pixel U, an amount of received background light is large. When a ratio of an amount of received background light to an amount of received weak light which is an object to be detected is large, it is difficult to cut a background light component. Since a PN junction capacitance of the photodiode is large, a response speed from receiving weak light until outputting a signal is slow.

In order to increase a gain of an operational amplifier circuit connected to a photodiode to detect weak light, a response speed of the operational amplifier circuit must be decreased or supply of power must be increased. When the response speed of the operational amplifier circuit decreases, a steepness at a rise of the input signal may not be accurately transmitted to a subsequent stage circuit connected to the operational amplifier circuit. When the supply of power to the operational amplifier circuit increases, power consumption of the entire device increases significantly.

In the back-illuminated semiconductor light detecting device 1, for each of the pixels U that are two-dimensionally disposed, the light detecting substrate 10 includes the plurality of avalanche photodiodes APD configured to operate in Geiger mode. The number of the plurality of signal processing units SP is larger than the number of light receiving regions S in each pixel U. In the back-illuminated semiconductor light detecting device 1, light sensitivity in each pixel is improved by the internal multiplication function of each of the avalanche photodiodes APD compared to a semiconductor light detecting device using a general photodiode. Therefore, even when the light receiving area of each pixel U is reduced to improve a resolution in imaging, the back-illuminated semiconductor light detecting device 1 detects weak light that cannot be easily detected in a light detecting device in which a general photodiode is used. The number of avalanche photodiodes APD in each pixel U is smaller than the number of signal processing units SP. The back-illuminated semiconductor light detecting device 1 has a smaller number of avalanche photodiodes APD electrically connected to one current mirror circuit 34 or 44 compared to a light detecting device in which the number of avalanche photodiodes APD in each pixel U is equal to or more than the number of the plurality of signal processing units SP. Therefore, a load on the current mirror circuit 34 or 44 is reduced.

Background light is noise with respect to weak light. When the light receiving area of each pixel U is small, since a ratio of an amount of received background light to an amount of received weak light is small compared to a case in which the light receiving area of each pixel U is large, a background light component per a pixel U is small. Also, when the light receiving area of each pixel U is small, a sum of PN junction capacitances of the avalanche photodiodes APD in each pixel U is also small Therefore, an output signal having a steep rise can be obtained from each of the avalanche photodiodes APD.

In the back-illuminated semiconductor light detecting device 1, each signal processing unit SP includes the current mirror circuit 34 or 44. In the back-illuminated semiconductor light detecting device 1, since each avalanche photodiode APD has the internal multiplication function, the signal processing unit SP does not require amplification using an operational amplifier circuit. The current mirror circuit 34 or 44 outputs a signal corresponding to the output signal from the plurality of avalanche photodiodes APD. Compared to an operational amplifier circuit, the current mirror circuit 34 or 44 is more power-saving, has a faster response speed, and thus accurately transmits information of the input signal. The information of the input signal may include, for example, a signal waveform. Therefore, the current mirror circuit 34 or 44 accurately transmits a steepness at a rise of the output signal from each of the avalanche photodiodes APD. As a result, the back-illuminated semiconductor light detecting device 1 detects weak light and has a high time resolution of a detection signal.

As described above, even when the light receiving area of each pixel U is reduced, the back-illuminated semiconductor light detecting device 1 detects weak light that cannot be easily detected with a light detecting device in which a general photodiode is used. Therefore, the number of pixels can be increased in the back-illuminated semiconductor light detecting device 1. Accordingly, the resolution of the back-illuminated semiconductor light detecting device 1 is high.

As described above, the back-illuminated semiconductor light detecting device 1 detects weak light with high accuracy and power saving. In the back-illuminated semiconductor light detecting device 1, the number of signal processing units SP having the current mirror circuit 34 or 44 is larger than the number of light receiving regions S of each pixel U. In the back-illuminated semiconductor light detecting device 1, a signal amplified by the internal multiplication function of each avalanche photodiode APD can be obtained, and high frequency response characteristics can be obtained without causing a significantly large amount of current to flow through the circuit. As a result, in the back-illuminated semiconductor light detecting device 1, both of improvement in light detection characteristics and realization of a high dynamic range are achieved. The light detection characteristics may be, for example, light detection sensitivity, a time resolution, and a spatial resolution. "High accuracy" indicates, for example, that a weak signal with a high S/N is detected and that a time resolution is high.

Figure 13:
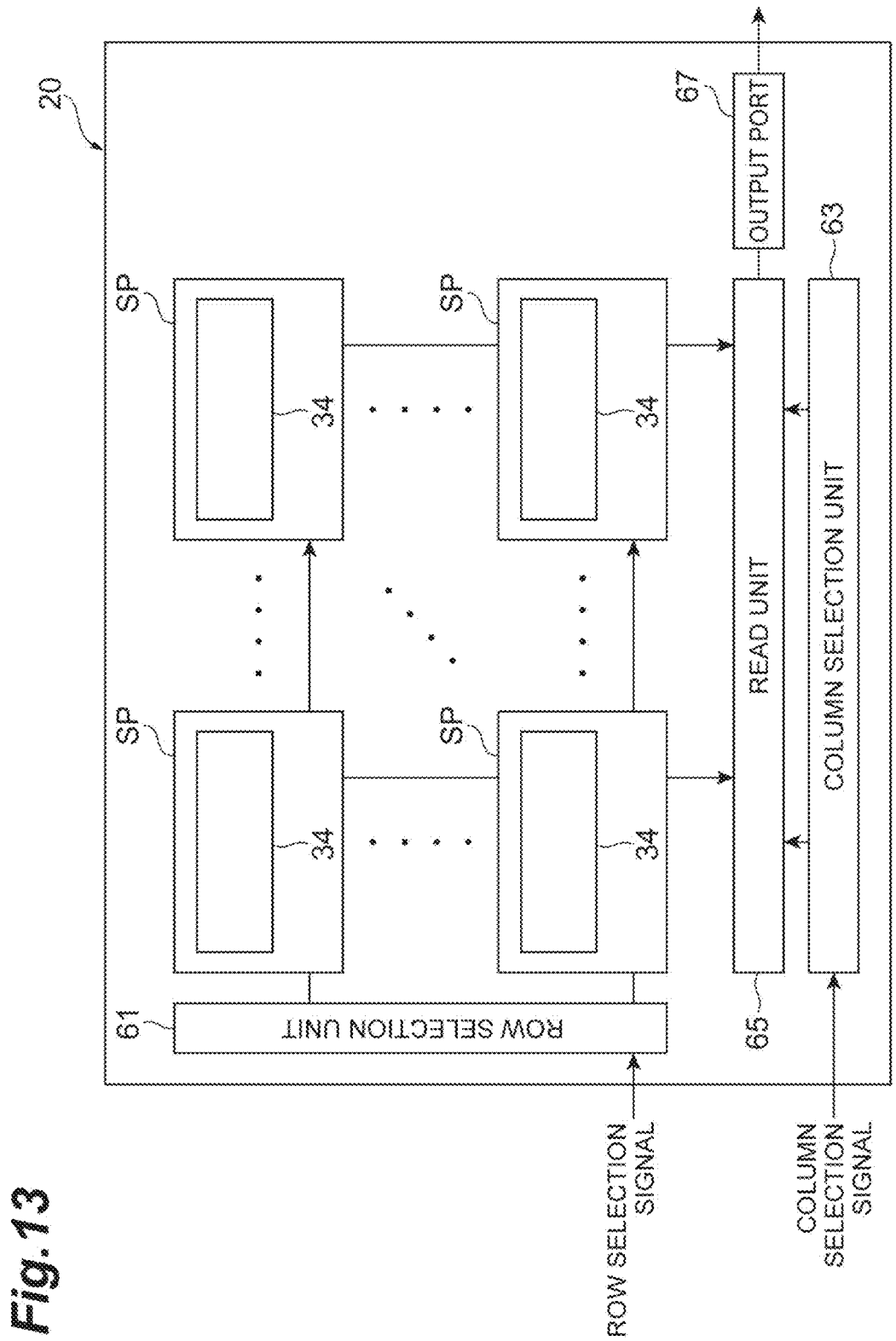
FIG. 13 is a view illustrating a configuration of a circuit substrate.

In the light detecting substrate 10, the plurality of pixels U are disposed in M rows and N columns. In the circuit substrate 20, the plurality of signal processing units SP are disposed in M rows and N columns corresponding to the disposition of the pixels U. M is an integer of 2 or more, and N is an integer of 2 or more. As illustrated in FIG. 13, the back-illuminated semiconductor light detecting device 1 includes a row selection unit 61, a column selection unit 63, and a read unit 65. The row selection unit 61, the column selection unit 63, and the read unit 65 may be provided in, for example, the circuit substrate 20. The signal processing unit SP outputs a signal to a read signal line on the basis of a control signal received from the row selection unit 61 through a control signal line. The signal output from the signal processing unit SP is input to the read unit 65 through the read signal line. The row selection unit 61 selects a row to output a signal on the basis of a row selection signal output from a control unit (not illustrated) and outputs a control signal to the signal processing unit SP included in the selected row. The row selection unit 61 may include, for example, a shift register or a random access decoder. The read unit 65 sequentially outputs signals output from the signal processing units SP on the basis of a control signal received from the column selection unit 63 through a control signal line. The column selection unit 63 selects a column to output a signal on the basis of a column selection signal output from the control unit and outputs a control signal to the read unit 65 to output a signal of the selected column. The signal output from the read unit 65 is output from the circuit substrate 20 through an output port 67. The column selection unit 63 may include, for example, a shift register or a random access decoder. The control unit may be provided on the circuit substrate 20 or may be provided on another substrate different from the circuit substrate 20.

As described above, in the back-illuminated semiconductor light detecting device 1, an output from each pixel U is sequentially read through the corresponding signal processing unit SP and is output from the circuit substrate 20 of the back-illuminated semiconductor light detecting device 1. Therefore, the back-illuminated semiconductor light detecting device 1 configures an image sensor having the light receiving regions S configured to operate in Geiger mode. The back-illuminated semiconductor light detecting device 1 has a dynamic range while maintaining a spatial resolution as the image sensor. In contrast, a single photon avalanche diode (SPAD) having a single light receiving region for each pixel does not have a dynamic range.

Each of the signal processing units SP includes the grounded-gate circuit 31 or 41. The grounded-gate circuit 31 or 41 is inserted between the pad electrode PE1 and the current mirror circuit 34 or 44. The output signal from the plurality of avalanche photodiodes APD is input to the grounded-gate circuit 31 or 41 through the corresponding pad electrode PE1. An output signal from the grounded-gate circuit 31 or 41 is input to the current mirror circuit 34 or 44. Input impedance of the grounded-gate circuit 31 or 41 is lower compared to input impedance of a read circuit other than the grounded-gate circuit. Therefore, the grounded-gate circuit 31 or 41 accurately transmits steepness at a rise of the output signal from each avalanche photodiode APD. As a result, each signal processing unit SP more accurately transmits steepness at a rise of the output signal from each avalanche photodiode APD.

Each signal processing unit SP includes the comparator 35. An output signal from the current mirror circuit 34 or 44 is input to the comparator 35. Therefore, each signal processing unit SP detects a signal having a desired pulse height among the signals input to the comparator 35. Noise such as, for example, dark count is properly eliminated by the comparator 35. In the present embodiment, the variable voltage source 36 is connected to the second input terminal of the comparator 35. A voltage applied to the second input terminal is appropriately adjusted by the variable voltage source 36. Therefore, a target signal is detected in the signal processing unit SP even when a pulse height of noise changes due to ambient light. The target signal has a peak value that is higher than a pulse height of noise.

The trench 13 is formed in the semiconductor substrate 50 to surround the entire circumference of each light receiving region S when viewed from the Z-axis direction. Therefore, interference between adjacent avalanche photodiodes APD is prevented. For example, in avalanche photodiodes configured to operate in Geiger mode, light emission due to recombination of carriers following avalanche multiplication may occur. The avalanche photodiode APD may receive light emitted by an avalanche photodiode APD positioned adjacent to it. In the back-illuminated semiconductor light detecting device 1, it is suppressed by the trench 13 that light emitted by the avalanche photodiode APD is transmitted to an avalanche photodiode APD positioned adjacent to it.

While preferred embodiments and modified examples of the present invention have been described above, the present invention is not necessarily limited to the above-described embodiments and modified examples, and various modifications can be made without departing from the gist of the present invention.

For example, the back-illuminated semiconductor light detecting device 1 may not include the comparator 35. The back-illuminated semiconductor light detecting device 1 may include an inverter instead of the comparator 35. In this case, an output signal from the current mirror circuit 34 or 44 is input to the inverter. When the back-illuminated semiconductor light detecting device 1 includes an inverter, the signal processing unit SP of the back-illuminated semiconductor light detecting device 1 detects a desired signal from which noise equal to or less than a fixed pulse height is eliminated.

The grounded-gate circuit 31 or 41 may have either an N-channel MOS FET or a P-channel MOS FET.

Sizes of the FETs 34*a* and 34*b* included in the current mirror circuit 34 may be different from each other. Sizes of the FETs 44*a* and 44*b* included in the current mirror circuit 44 may also be different from each other. When sizes of the FETs 34*a* and 34*b* paired with each other and sizes of the FETs 44*a* and 44*b* paired with each other are each different from each other, steepness at a rise of an output signal from each avalanche photodiode APD can be maintained and an output can be amplified. In this case, the current mirror circuit 34 or 44 can configure an amplifier circuit. A size of the FET indicates a gate length.

In the above-described embodiments and modified examples, the trench 13 is formed in the semiconductor substrate 50 for each light receiving region S. The quenching resistor 21, the pad electrode PE1, and the electrode E2 may be covered with one insulating layer.

A single layer structure of the avalanche photodiode APD is illustrated in the above-described embodiments and modified examples, but a layer structure of the avalanche photodiode APD is not limited thereto. For example, the first semiconductor region PA and the second semiconductor region PB may have conductivity types different from each other. In this case, a PN junction is formed by the first semiconductor region PA and the second semiconductor region PB. For example, the second semiconductor region PB may be configured by a plurality of semiconductor regions in which impurity concentrations are different from each other. For example, the avalanche photodiode APD may include a first conductivity type semiconductor region, and a second conductivity type semiconductor region positioned in the first conductivity type semiconductor region and forming a pn junction with the first conductivity type semiconductor region. In the present configuration, the second conductivity type semiconductor region is a light receiving region. The first conductivity type may be, for example, an N-type. The second conductivity type may be, for example, a P-type.

The light detecting substrate 10 and the circuit substrate 20 are connected by the bump electrode BE in the above-described embodiments and modified examples, but a configuration of the back-illuminated semiconductor light detecting device 1 is not limited thereto. That is, the pad electrode PE1 of the light detecting substrate 10 and the signal processing unit SP of the circuit substrate 20 may be electrically connected without the bump electrode BE interposed therebetween.

The back-illuminated semiconductor light detecting device 1 may not include the glass substrate 30. In this case, the light detecting substrate 10 may be manufactured with the semiconductor substrate 50 joined to the glass substrate 30, and then the glass substrate 30 may be removed from the semiconductor substrate 50.

One pad electrode PE1 is provided for each pixel U in the present embodiment and the modified example, but a plurality of pad electrodes PE1 may be provided for each pixel U. In this case also, the plurality of avalanche photodiodes APD are electrically connected to one of the pad electrodes PE1. For example, a part of the avalanche photodiodes APD included in one of the pixels U may be connected to one of the pad electrodes PE1, and the remaining avalanche photodiodes APD may be connected to a different pad electrode PE1. In this case also, the number of pad electrodes PE1 included in one of the pixels U is smaller than the number of avalanche photodiodes APD included in the pixel U. In this case, the plurality of pad electrodes PE1 included in each pixel U are electrically connected to one signal processing unit SP.

The signal processing unit SP may be a front-end circuit that functions as an amplifier circuit without including the current mirror circuit 34 or 44.

INDUSTRIAL APPLICABILITY

The present invention can be utilized for a back-illuminated semiconductor light detecting device that detects weak light.

REFERENCE SIGNS LIST

1 Back-illuminated semiconductor light detecting device
10 Light detecting substrate
20 Circuit substrate
21 Quenching resistor
31, 41 Grounded-gate circuit
34, 44 Current mirror circuit
35 Comparator
50 Semiconductor substrate
1Na, 1Nb, 20a Main surface
APD Avalanche photodiode
S Light receiving region
U Pixel
PE1 Pad electrode
SP Signal processing unit

The invention claimed is:

1. A back-illuminated semiconductor light detecting device comprising:
   a light detecting substrate including a semiconductor substrate having a first main surface and a second main surface facing each other and including a plurality of pixels which are two-dimensionally disposed on the semiconductor substrate; and
   a circuit substrate connected to the light detecting substrate and including a plurality of signal processing units, each of the signal processing units configured to process an output signal from a corresponding pixel of the pixels, wherein
   the light detecting substrate includes, for each of the pixels,
   a plurality of avalanche photodiodes respectively having light receiving regions provided in the first main surface side of the semiconductor substrate and configured to operate in Geiger mode;
   a plurality of quenching resistors disposed on the first main surface side of the semiconductor substrate, each of the quenching resistors electrically connected in series to a corresponding avalanche photodiode of the avalanche photodiodes; and
   pad electrodes disposed on the first main surface side of the semiconductor substrate and electrically connected to the plurality of quenching resistors,
   the light receiving regions of the plurality of avalanche photodiodes are two-dimensionally disposed for each pixel,
   a trench opening to the first main surface is formed in the semiconductor substrate,
   the trench surrounds at least one region including the light receiving region for each pixel when viewed from a direction perpendicular to the first main surface,
   each of the signal processing units includes a front-end circuit to which the plurality of avalanche photodiodes are electrically connected through a corresponding pad electrode of the pad electrodes and which outputs a signal corresponding to an output signal from the plurality of avalanche photodiodes,
   the number of the plurality of signal processing units included in the circuit substrate is larger than the number of the light receiving regions in each of the pixels,
   the number of regions surrounded by the trench in each of the pixels is equal to or less than the number of the light receiving regions in the pixel, and
   the second main surface is a light incident surface of the semiconductor substrate.

2. The back-illuminated semiconductor light detecting device according to claim 1, wherein the trench penetrates the semiconductor substrate and opens to the second main surface.

3. The back-illuminated semiconductor light detecting device according to claim 1, wherein the pad electrode is disposed on the first main surface side to overlap all of the plurality of avalanche photodiodes included in the pixel when viewed from a direction perpendicular to the first main surface.

4. The back-illuminated semiconductor light detecting device according to claim 1, wherein, for each of the pixels, the trench surrounds a region in which the pixel is formed when viewed from a direction perpendicular to the first main surface.

5. The back-illuminated semiconductor light detecting device according to claim 1, wherein, for each of the pixels, the trench surrounds each of the light receiving regions when viewed from a direction perpendicular to the first main surface.

6. The back-illuminated semiconductor light detecting device according to claim 1, wherein each of the signal processing units includes a current mirror circuit to which the plurality of avalanche photodiodes are electrically connected through the corresponding pad electrode and which outputs a signal corresponding to an output signal from the plurality of avalanche photodiodes.

7. The back-illuminated semiconductor light detecting device according to claim 6, wherein
each of the signal processing units further includes a grounded-gate circuit which is inserted between the corresponding pad electrode and the current mirror circuit and to which an output signal from the plurality of avalanche photodiodes is input through the corresponding pad electrode, and
an output signal from the grounded-gate circuit is input to the current mirror circuit.

8. The back-illuminated semiconductor light detecting device according to claim 6, wherein each of the signal processing units further includes a comparator to which an output signal from the current mirror circuit is input.

* * * * *